United States Patent [19]

Murata et al.

[11] Patent Number: 4,894,752

[45] Date of Patent: Jan. 16, 1990

[54] LEAD FRAME FOR A SEMICONDUCTOR DEVICE

[75] Inventors: Akihiko Murata; Toshihiko Shimada, both of Nagano, Japan

[73] Assignee: Shinko Electric Industries, Co., Ltd., Nagano, Japan

[21] Appl. No.: 218,882

[22] Filed: Jul. 14, 1988

[30] Foreign Application Priority Data

Jul. 14, 1987 [JP] Japan .................. 62-175481

[51] Int. Cl.$^4$ ............................................ H05K 5/02
[52] U.S. Cl. ........................................ 361/421; 357/70
[58] Field of Search ................. 174/52 FP, ; 357/70, 357/71; 361/402, 414, 421

[56] References Cited

U.S. PATENT DOCUMENTS 3,860,835  1/1975  Brymer et al. .............. 357/71
4,182,781  1/1980  Hooper et al. .............. 357/71
4,628,149 12/1986  Dohya ........................ 361/402

OTHER PUBLICATIONS

V. A. Pitt et al., Thermosonic Gold Wire Bonding To Copper Conductors, May 10-12, 1982, pp. 81-86, IEEE, 1982 Proc. 32nd Electronic Components COnf., San Diego, Calif.

K. Atsumi et al., Ball Bonding Technique For Copper Wire, pp. 312-317, 1986 IEEE.

L. Levin et al., Copper Ball Bonding, Aug. 1986, pp. 126-129, Semiconductor International.

G. McGill et al., Aluminum Wire As A Viable Alternative To Gold For Ball Bonding, Aug. 1983, pp. 92-95, Semiconductor International.

J. F. Graves et al., Reliability Effects of Fluorine Contamination of Aluminum Bonding Pads on Semiconductor Chips, Oct. 1983, pp. 227-231, Solid State Technology.

B. L. Gehman et al., Aluminum Wire for Thermosonic Ball Bonding in Semiconductor Devices, Oct. 1983, pp. 151-157 Solid State Technology.

*Primary Examiner*—Gregory D. Thompson
*Attorney, Agent, or Firm*—Staas & Halsey

[57] ABSTRACT

A lead frame for a semiconductor device includes a metal strip made of copper or copper alloy having a plurality of wire bonding areas to which metal wires are directly connected by a direct bonding method. The wire bonding areas are electroplated with a thin silver film or a palladium film, so that formation of a copper oxidized film on the wire bonding area is substantially prevented.

7 Claims, 1 Drawing Sheet

LEAD FRAME FOR A SEMICONDUCTOR DEVICE

BACKGROUND OF THE INVENTION

1. Field of the Invention

This invention relates to a lead frame used for a semiconductor device.

2. Description of the Related Art

Conventionally, a semiconductor device is known which comprises: a lead frame having a die pad area and a plurality of leads around the die pad area; a semiconductor chip mounted on said die pad area and having a plurality of connecting terminals; metal wires for connecting tips of the respective leads to the terminals of said semiconductor chip; and a mold resin material for hermetically sealing at least a region including the semiconductor chip and the tips of the leads around the semiconductor chip.

In such a semiconductor device, to stably and easily connect the semiconductor chip to the leads by wires, the wire bonding area of each lead of the lead frame is electroplated with gold or silver. This is both expensive and laborious. Recently, however, it has been proposed that, to improve the production rate, the wire bonding area of the lead frame is not electroplated with gold or silver, but the wire is directly connected by a thermo-sonic method to the wire bonding area of the lead frame. In this case, a copper material is exposed on the wire bonding area of the lead frame which is made of copper or copper alloy electroplated with copper, or not electroplated.

As mentioned above, in a lead frame having a wire bonding area to which a wire is directly connected, the wire bonding areas of the lead frame are not electroplated with gold or silver, but a copper material is directly exposed to the outside. Therefore, the wire bonding area of the lead frame may be easily oxidized by oxygen in the atmosphere. Thus, a copper oxidized film may form on the surface of the wire bonding area while the lead frame is transported or a semiconductor chip is fixed on the die pad area in a heated condition. In such a lead frame, therefore, the copper oxidized film makes it impossible to directly connect the wire to the wire bonding area by a thermo-sonic method.

To prevent the copper oxidized film from being formed on the wire bonding area on which a copper material is exposed, the lead frame is packed in a vacuum condition while the lead frame is transported or put in a reduction environment filled with an inert gas, during wire bonding process by thermo-sonic method. These proposals have drawbacks such as the need for a large amount of laborious work, special installations, and expensive inert gases.

SUMMARY OF THE INVENTION

An object of the present invention is to provide a lead frame for a semiconductor device, in which the formation of a copper oxidized film on the wire bonding area, on which a copper material is exposed and to which a wire is directly connected, is substantially prevented so that the wire can be easily and stably connected to the wire bonding area by a direct bonding method.

Another object of the present invention is to provide a lead frame for a semiconductor device, in which the disadvantages mentioned above can be overcome.

According to the present invention, a lead frame for a semiconductor device comprises: a metal strip made of copper or copper alloy; a die pad area on which a semiconductor chip having a plurality of connecting terminals is mounted; a plurality of leads formed around the die pad area, each of the leads having a tip defining a wire bonding area which is connected to a connecting terminal of said semiconductor chip via a metal wire; and a part of the lead frame including at least wire bonding areas plated with a thin silver or palladium film.

As the wire bonding areas of the lead frame according to the present invention are plated with thin silver or palladium film, the formation of a copper oxidized film on the wire bonding areas is substantially prevented. Therefore, metal wires, such as gold or copper wires, can be easily and stably joined with the copper materials of the wire bonding areas when the wires are connected to the wire bonding area by a direct bonding method, without being affected by a copper oxidized film.

DETAILED DESCRIPTION OF THE PREFERRED EMBODIMENTS

Figure 1:
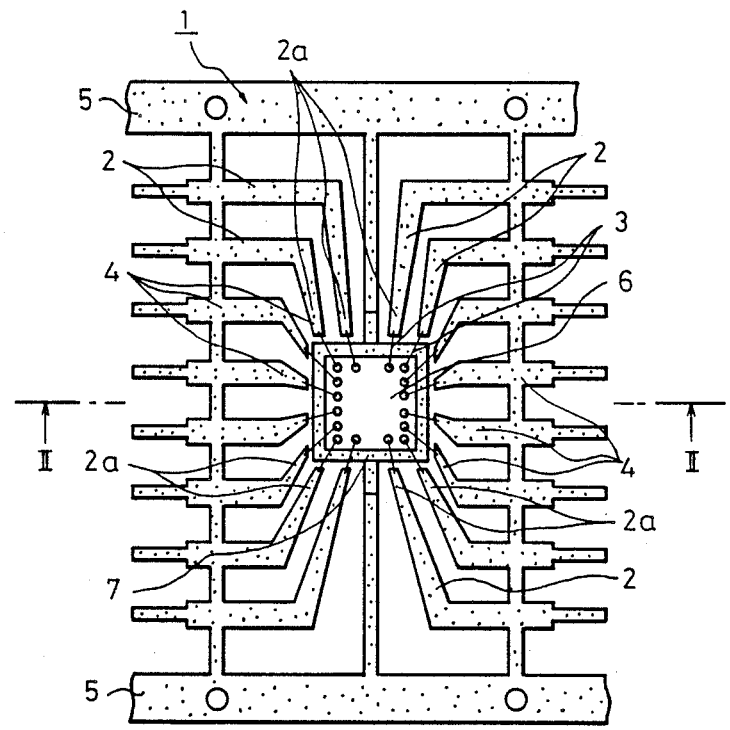
FIG. 1 is a plan view of a lead frame used for a semiconductor device according to the present invention.
Figure 2:
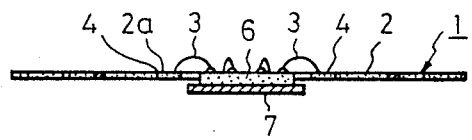
FIG. 2 is a cross-sectional view taken along line II—II in FIG. 1.

Referring now to the drawings, FIGS. 1 and 2 show a preferred embodiment of a semiconductor lead frame according to the present invention. FIG. 1 is a plan view for illustrating a lead frame in use and FIG. 2 is a cross-sectional view taken along line II—II in FIG. 1.

In the drawings, a lead frame generally indicated by a reference numeral 1 is made of a strip of copper or copper alloy, a surface thereof being plated with copper, or not plated, including a die pad area 7, on which a semiconductor chip 6 is mounted. A plurality of leads 2 are arranged between upper and lower guide rails 5.

The whole peripheral area of a front surface of the lead frame 1, being plated with copper, or not plated, but directly exposed to the copper material, including a front surface of a tip of each lead 2, i.e., a wire bonding area 2a, is plated with a very thin silver coating, the thickness thereof being, for example, from a molecular level to about 0.1 $\mu$m. In order to plate the lead frame 1 with such a very thin silver coating, the lead frame 1 made of copper or copper alloy, the front surface thereof being plated with copper, or not plated, is dipped, for example, for about 20 seconds in a plating solution including potassium silver cyanide, KAg(CN)$_2$, of 10 gW/l and potassium cyanide, KCN, of 5 gW/l, using electroless plating, and a very thin silver layer 4 is thus formed over the whole peripheral area of the front surface of the lead frame 1. A semiconductor lead frame according to this invention is constructed as mentioned above and shown in FIGS. 1 and 2.

The operation of a semiconductor lead frame according to this invention will now be described. The whole peripheral area of the front surface of the lead frame 1, including the wire bonding area 2a, is first plated with a very thin silver 4. Therefore a copper oxidizing film is not substantially formed on the wire bonding area 2a, on which a copper material is exposed, while the lead frame 1 is transported or moved, or a semiconductor chip 6 is rigidly mounted on the die pad area 7 by applying heat thereto. Therefore, a wire 3 can be always directly connected to the wire bonding area 2a of the lead frame 1 by direct bonding, i.e., a thermo-sonic method. Also, since the thin silver film 4 is plated on the wire bonding area 2a, when the wire 3, such a copper or gold wire, is directly connected to the wire bonding area 2a of the lead frame 1 by a thermosonic method, the plated silver film 4 formed on the wire bonding area 2a does not prevent a stable and reliable connection between the wire 3 and the wire bonding area 2a exposing a copper material.

In the above-mentioned embodiment, the peripheral front surface of the lead frame, on which a copper material is exposed, may be electroplated with a very thin silver film having a uniform thickness, by dipping the lead frame 1 in an electroplating solution including potassium silver cyanide, $KAg(CN)_2$, as mentioned above, using electroless plating. Otherwise, after the peripheral front surface of the lead frame, except for the wire bonding area 2a, is covered by a rubber mask, for example, the lead frame 1 may be dipped in a plating solution, so that only the wire bonding area 2a is plated with a very thin silver film.

A wire 3 made of gold, aluminum, and the like also can be used in place of a copper wire as mentioned above, and directly connected to the wire bonding area 2a of the lead frame 1 by a thermo-sonic method, ultrasonic method, thermo compression method, or any other bonding method. In this case, the wire made of gold, aluminum, and the like also can be stably and reliably connected to the wire bonding area 2a of the lead 2.

According to the present invention, since the formation of a copper oxidizing film on the wire bonding area 2a of the lead frame is prevented it is not necessary to pack the lead frame in a vacuum condition nor in an inert gas while the lead frame is transported, as in the prior art. Also, it is not necessary to put the connecting terminals of the semiconductor chip and the leads of the lead frame in a reduction environment filled with an inert gas, as in the prior art, while a wire is connected between the terminals of the semiconductor chip and the wire bonding area of the lead frame by a thermosonic method.

According to a lead frame of the present invention, the color of the area of the lead frame including the wire bonding area 2a, which is plated with a silver film, will not change over a long period of use and, therefore, the appearance of the lead frame can be maintained in a good condition for a long time.

In the above-mentioned embodiment, the wire bonding area 2a can be also plated with a very thin palladium film instead of the silver film. Such a thin palladium film may be formed by electroplating or electroless plating, in the same manner as the silver film, and have a thickness of, for example, from a molecular level to about 0.1 μm.

We claim:

1. A lead frame for mounting a semiconductor chip having a plurality of connecting terminals, comprising:
   upper and lower guide rails;
   a die pad on which the semiconductor chip is mountable;
   a plurality of leads coupled to the upper and lower guide rails and being disposed around said die pad;
   each of said leads having a tip defining a wire bonding area which is connectable with a wire to a corresponding connecting terminal of said semiconductor chip when mounted on said die pad; and
   a thin silver film plating having a thickness in a range between a molecular level to about 0.1 μm, covering the entire lead frame.

2. A lead frame as set forth in claim 1, wherein said lead frame is made of a material selected from the group consisting of copper and copper alloy.

3. A lead frame as set forth in claim 1, wherein said thin silver film comprises a plating solution including 10 gW/1 of the potassium silver cyanide $KAg(CN)_2$, and 5 gW/1 of potassium cyanide, KCN.

4. A lead frame for a semiconductor device comprising:
   a metal strip made of a material selected from the group consisting of copper and copper alloy and having a plurality of wire bonding areas to which metal wires are directly connectable by a direct bonding method; and
   a thin silver film plating having a thickness in a range between a molecular level to about 0.1 μm, covering the entire lead frame.

5. A lead frame for mounting a semiconductor chip having a plurality of connecting terminals comprising:
   upper and lower guide rails;
   a die pad on which the semiconductor chip is mountable;
   a plurality of leads coupled to the upper and lower guide rails and being disposed around said die pad;
   each of said leads having a tip defining a wire bonding area which is connectable with a wire to a corresponding connecting terminal of said semiconductor chip when mounted on the die pad; and
   a thin palladium film plating having a thickness in a range between a molecular level to about 0.1 μm, covering the entire lead frame.

6. A lead frame as set forth in claim 5, wherein said lead frame is made of a material selected from the group consisting of copper and copper alloy.

7. A lead frame for a semiconductor device comprising:
   a metal strip made of a material selected from the group consisting of copper and copper alloy and having a plurality of wire bonding areas to which metal wires are directly connectable by a direct bonding method; and
   a thin palladium film plating having a thickness in a range between a molecular level to about 0.1 μm, covering the entire lead frame.

* * * * *